(12) United States Patent
Takehara et al.

(10) Patent No.: US 7,081,661 B2
(45) Date of Patent: Jul. 25, 2006

(54) HIGH-FREQUENCY MODULE AND METHOD FOR MANUFACTURING THE SAME

(75) Inventors: Hideki Takehara, Kobe (JP); Noriyuki Yoshikawa, Ibaraki (JP); Kunihiko Kanazawa, Mukou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 418 days.

(21) Appl. No.: 10/098,895

(22) Filed: Mar. 13, 2002

(65) Prior Publication Data

US 2002/0153582 A1 Oct. 24, 2002

(30) Foreign Application Priority Data

Mar. 16, 2001 (JP) ........................ 2001-076373

(51) Int. Cl.
*H01L 31/00* (2006.01)

(52) U.S. Cl. .................. 257/433; 257/728; 257/434; 257/701; 257/704; 257/699; 257/707; 257/729; 257/698; 257/690; 257/787; 257/693; 257/730; 257/664; 257/666; 257/659; 257/703; 257/678; 257/790; 257/675; 257/684; 257/708

(58) Field of Classification Search .............. 257/434, 257/690, 698, 787, 693, 730, 728, 664, 666, 257/659, 703, 678, 790, 675, 684, 708, 699, 257/172.8, 443, 701, 704, 707, 729
See application file for complete search history.

(56) References Cited

U.S. PATENT DOCUMENTS

| | | | | |
|---|---|---|---|---|
| 5,455,384 A | * | 10/1995 | Ichihara | 174/52.2 |
| 5,574,314 A | * | 11/1996 | Okada et al. | 257/728 |
| 5,898,344 A | | 4/1999 | Hayashi | |
| 6,072,239 A | | 6/2000 | Yoneda et al. | |
| 6,159,770 A | | 12/2000 | Tetaka et al. | |
| 6,262,513 B1 | * | 7/2001 | Furukawa et al. | 310/313 R |
| 6,329,711 B1 | | 12/2001 | Kawahara et al. | |
| 6,365,961 B1 | * | 4/2002 | Tomie | 257/664 |
| 6,376,921 B1 | | 4/2002 | Yoneda et al. | |

FOREIGN PATENT DOCUMENTS

| | | |
|---|---|---|
| JP | 4-58596 | 2/1992 |
| JP | 9-307261 | 11/1997 |
| JP | 11-150143 | 6/1999 |
| JP | 2000-223647 | 8/2000 |
| JP | 2001-244688 | 9/2001 |

* cited by examiner

*Primary Examiner*—Eddie Lee
*Assistant Examiner*—Junghwa Im
(74) *Attorney, Agent, or Firm*—Hambre, Schumann, Mueller & Larson, P.C.

(57) ABSTRACT

In the high-frequency module of the present invention, an insulating resin is formed so as to seal a high-frequency semiconductor element mounted on a surface of a substrate and further to seal electronic components. Furthermore, a metal thin film is formed on the surface of the insulating resin. This metal thin film provides an electromagnetic wave shielding effect.

9 Claims, 12 Drawing Sheets

HIGH-FREQUENCY MODULE AND METHOD FOR MANUFACTURING THE SAME

BACKGROUND OF THE INVENTION

1. Field of the Invention

The present invention relates to a high-frequency module and a method for manufacturing the same.

2. Related Background Art

In high-frequency modules primarily used for mobile communication equipment such as portable telephones, a high-frequency circuit including a high-frequency semiconductor element and a peripheral circuit is formed on a substrate, and a metal cap often is disposed so as to cover a surface of the substrate on which the high-frequency circuit is disposed, in order to protect the high-frequency semiconductor element and shield it from electromagnetic waves. In ordinary conventional high-frequency modules, a high-frequency semiconductor element 102 and electronic components 103 such as chip resistors and chip capacitors are mounted on a substrate 101, and electrically connected to each other by thin metallic wires 104 or a wiring pattern (not shown in detail), thus forming a high-frequency circuit, as shown in FIG. 12. A metal cap 120 is fitted onto the substrate 101 or soldered thereto.

In the conventional high-frequency module shown in FIG. 12, however, the metal cap 120 has made it difficult to reduce the package height. When the metal cap 120 is made thinner, the strength of the metal cap 120 cannot be maintained, and thus, the metal cap becomes pliable so that it may come in contact with the high-frequency circuit. In order to avoid a short-circuit due to contact between the metal cap 120 and the high-frequency circuit, it is also necessary to provide a clearance below the metal cap 120 in view of the pliability of the metal cap 120. In an example, it was necessary to set the thickness of the metal cap 120 to about 100 μm, and set the clearance provided below the metal cap 120 to about 80 μm If this total thickness of about 0.2 mm could be reduced, then the height of the high-frequency module could be reduced further.

SUMMARY OF THE INVENTION

A high-frequency module according to the present invention includes a substrate; a high-frequency circuit that is mounted on a surface of the substrate and includes a high-frequency semiconductor element; an insulating resin formed so as to seal at least the high-frequency semiconductor element; and a metal thin film formed on a surface of the insulating resin. Herein, "high-frequency element" means a semiconductor element that is used at a frequency of at least 400 MHz.

With this high-frequency module, the influence of electromagnetic waves on the high-frequency circuit can be reduced by the metal thin film. Moreover, since the insulating resin supports the metal thin film, the strength or pliability is not a problem as in the case where a thin metal cap is provided, even though the thickness of the metal thin film is reduced. With the insulating resin, it is also possible to reduce the clearance provided below the metal cap. Thus, the height of the high-frequency module can be reduced.

The present invention provides also a method for manufacturing a high-frequency module in which a wiring pattern is electrically connected to a metal thin film on a surface of a substrate. In this manufacturing method, the insulating resin is formed by molding with a mold, or by irradiation with a laser beam or mechanical grinding performed after molding of the insulating resin, such that a part of the wiring pattern is exposed at the surface of the substrate.

In the above-mentioned manufacturing method, when a process such as irradiation with a laser beam is performed after the molding of the insulating resin, in order to improve the positioning precision in the process, it is preferable that irradiation with the laser beam or mechanical grinding is performed after positioning based on a mark (e.g., a depression such as a scribe line at which the substrate base material is to be divided into individual substrates, or a portion at which a different type of material such as an electrode for electrical connection to the outside is exposed) that is preformed on an opposed face of a surface of the substrate on which a high-frequency circuit is disposed. This method is effective in particular when a ceramic is used as a substrate material, which makes it difficult to avoid distortions due to baking. In this case, the mark is formed before baking the substrate and the process such as irradiation with the laser beam should be performed while positioning with reference to the mark after baking the substrate.

DETAILED DESCRIPTION OF THE INVENTION

In the high-frequency module according to the present invention, it is preferable that a wiring pattern that, along with the high-frequency semiconductor element, constitutes a high-frequency circuit on a surface of the substrate is connected electrically to a metal thin film in order to increase the electromagnetic wave shielding effect. More specifically, a first region in which an insulating resin is formed and a second region in which no insulating resin is formed are provided on the aforementioned surface of the substrate, and the wiring pattern exposed at the surface of the substrate in the second region may be connected electrically to the metal thin film.

When the insulating resin is provided with an aperture so that the wiring pattern is exposed, then it is preferable that the aperture of the insulating resin has a minimum width of at least 0.2 mm and at most 5 mm. If the minimum width is too small, then it becomes difficult to ensure stable electrical contact with the metal thin film, whereas if the minimum width is too large, then the mounting area is limited, which is a disadvantage for miniaturization of the module.

It is preferable that the wiring pattern be connected electrically to the metal thin film is a wiring pattern through which no high-frequency signal is transmitted, and, even though there is no limitation to the potential, if the wiring pattern is connected to a ground potential, then the electromagnetic wave shielding effect can be increased further.

The film thickness of the metal thin film is preferably at least 1 μm and at most 300 μm. If the film thickness is too small, then the electromagnetic wave shielding effect cannot be obtained sufficiently, whereas if the film thickness is too large, then the height of the module cannot be sufficiently reduced.

Hereinafter, preferred embodiments of the present invention will be described.

Figure 1:
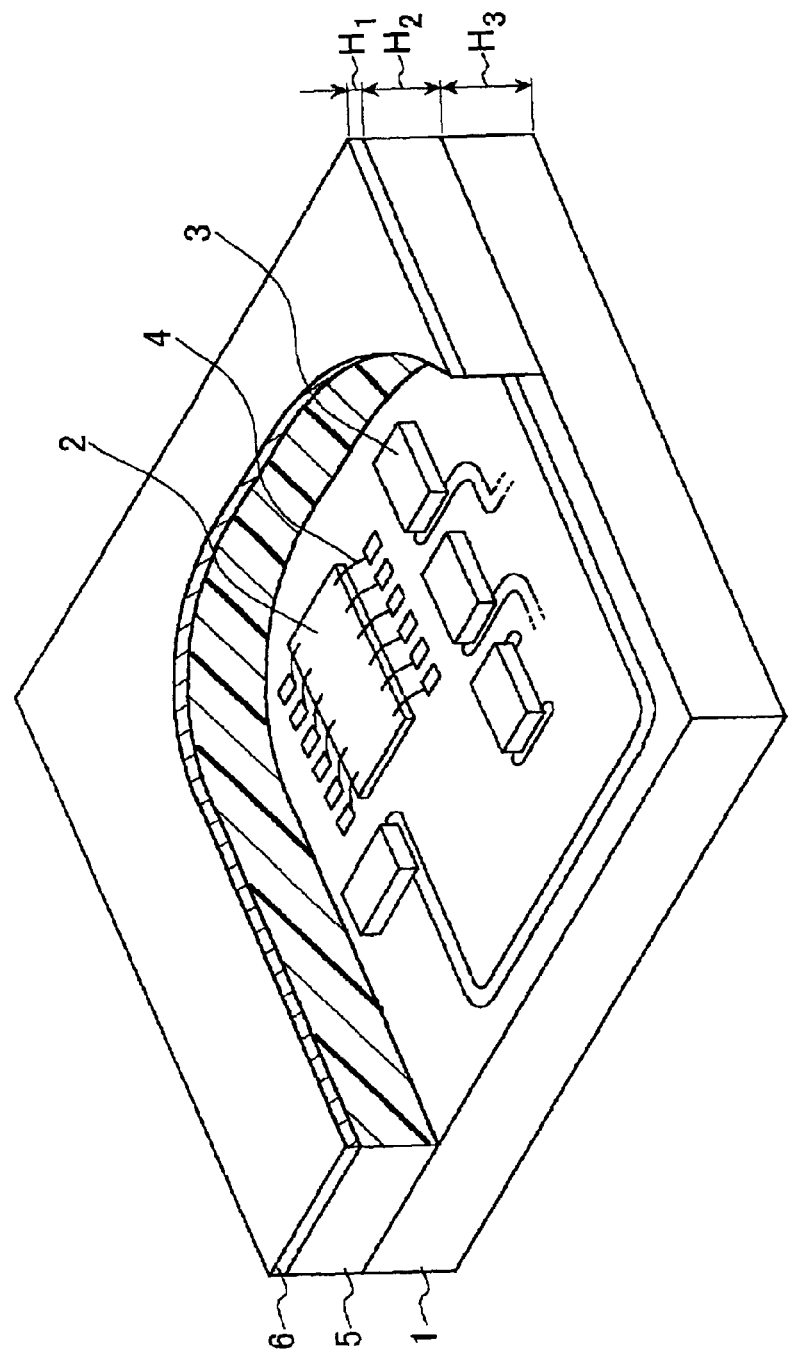
FIG. 1 is a partially cutaway perspective view of one embodiment of a high-frequency module according to the present invention, in which an insulating resin and a metal thin film are partially broken away.

FIG. 1 is a partially cutaway perspective view of one embodiment of a high-frequency module according to the present invention, in which, for the sake of convenience, an insulating resin is shown as partially removed in order to illustrate the internal structure. As in the related art, a high-frequency semiconductor element 2 and electronic components 3 such as chip resistors and chip capacitors are disposed on a substrate 1. The element 2 and the electronic components 3 are connected to each other by a wiring pattern not shown in detail. The high-frequency semiconductor element 2 is connected electrically to the wiring pattern by thin metallic wires 4. Furthermore, a surface of the substrate 1 is covered with an insulating resin 5, and a metal thin film 6 is formed on a surface of this insulating resin 5.

When the high-frequency semiconductor element 2 and the electronic components 3 are sealed airtightly by the insulating resin 5 in this manner, such properties as moisture resistance and impact resistance can be improved in comparison with the case I which that a metal cap is used, for example. Using the metal cap required a soldering step in some cases, and as lead-free solder was adopted, it became necessary to perform the soldering at high temperature, and the resulting heat could negatively affect the parts and the substrate of the high-frequency module. On the other hand, when the insulating resin 5 is used, such a soldering step can be eliminated.

Furthermore, the insulating resin 5 can provide a stable "base" for supporting the metal thin film 6. The metal thin film 6 can be formed on this base by applying any of the various types of methods for forming a thin film such as vapor deposition, sputtering or plating. As is apparent from the measurement results listed below, the film thickness (FIG. 1: $H_1$) of the metal thin film, which is necessary to achieve a practical electromagnetic wave shielding effect, is about two orders of magnitude smaller than that of the metal cap that has been used conventionally. It should be noted that there is no particular limitation regarding the method for forming the insulating resin 5, and it can be formed by transfer molding, printing, or injection molding, for example.

With the high-frequency module of the present invention, when using a 6 mm square ceramic substrate having a thickness of 1 mm (FIG. 1: $H_3$), it becomes possible to set the module height (FIG. 1: $H_1+H_2+H_3$) to 1.65 mm or less. Such a module thickness is at least about 0.2 mm smaller than that when the electromagnetic wave shielding effect is attained by using a metal cap at the same parameters.

There is no particular limitation regarding types and materials of the insulating resin 5 or the metal thin film 6, as long as the object of the present invention can be achieved. For example, thermosetting resins such as epoxy resins can be used for the insulating resin 5, whereas gold, silver, copper or nickel can be used for the metal thin film 6, for example. The metal thin film 6 does not have to be single-layered, and may be multilayered. For example, if the metal thin film 6 is formed by plating, and if the metal thin film 6 has a multilayered structure including copper, nickel and flash gold provided in this order on the insulating resin 5, then the metal thin film 6 can be adhered to the insulating resin 5 more strongly, and the sheet resistance of the metal thin film 6 can be reduced. When the thicknesses of the layers included in this multilayered structure are set to 1 μm, 0.5 μm and 0.05 μm in the above-described order (with total thickness of 1.5 to 1.6 μm), an electromagnetic wave shielding effect that is comparable to that of 3 μm electroless nickel plating can be obtained. When the high-frequency module using the 6 mm square ceramic substrate having a thickness of 1 mm, it is preferable that a minimum thickness of the metal film 6 is at least 2 μm and at most 3 μm in order to obtain the electromagnetic wave shielding effect uniformly over a large area. Furthermore, it is preferable that a maximum thickness of the metal film 6 is 10 μm in order to mass-produce metal film 6 using a various methods for forming thin film, and further reduce the height of the high-frequency module.

For the substrate 1, the high-frequency semiconductor element 2 and the electronic components 3, it is possible to use conventional parts without limitation. Usually, resin substrates or ceramic substrates are used as the substrate 1.

Although the metal thin film 6 can shield the electromagnetic waves to some extent even when it is electrically floating, as shown in FIG. 1, it should be connected to the wiring pattern on the surface of the substrate in order to increase this shielding effect. Examples of the connection between the metal thin film 6 and the wiring pattern will be described in the following.

Figure 2:
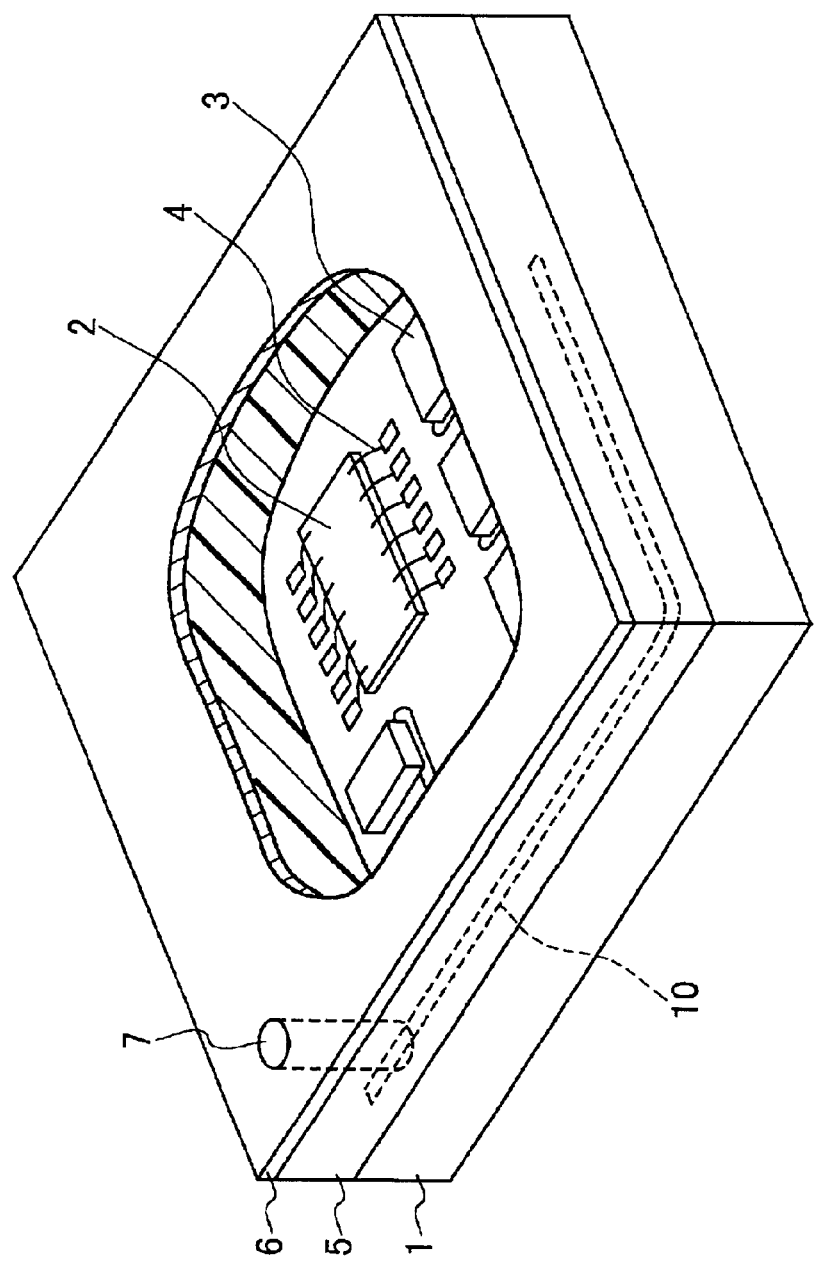
FIG. 2 is a partially cutaway perspective view of another embodiment of the high-frequency module according to the present invention.

In the high-frequency module shown in FIG. 2, the insulating resin 5 is provided with a circular hole (aperture) 7 exposing a wiring pattern 10. The wiring pattern 10 is electrically connected to the metal thin film 6 provided on the surface of the insulating resin 5 by a metal thin film formed on the inner surface (bottom and side faces) of this hole 7. Preferably, the wiring pattern 10 is a grounding line connected to ground potential.

Figure 3:
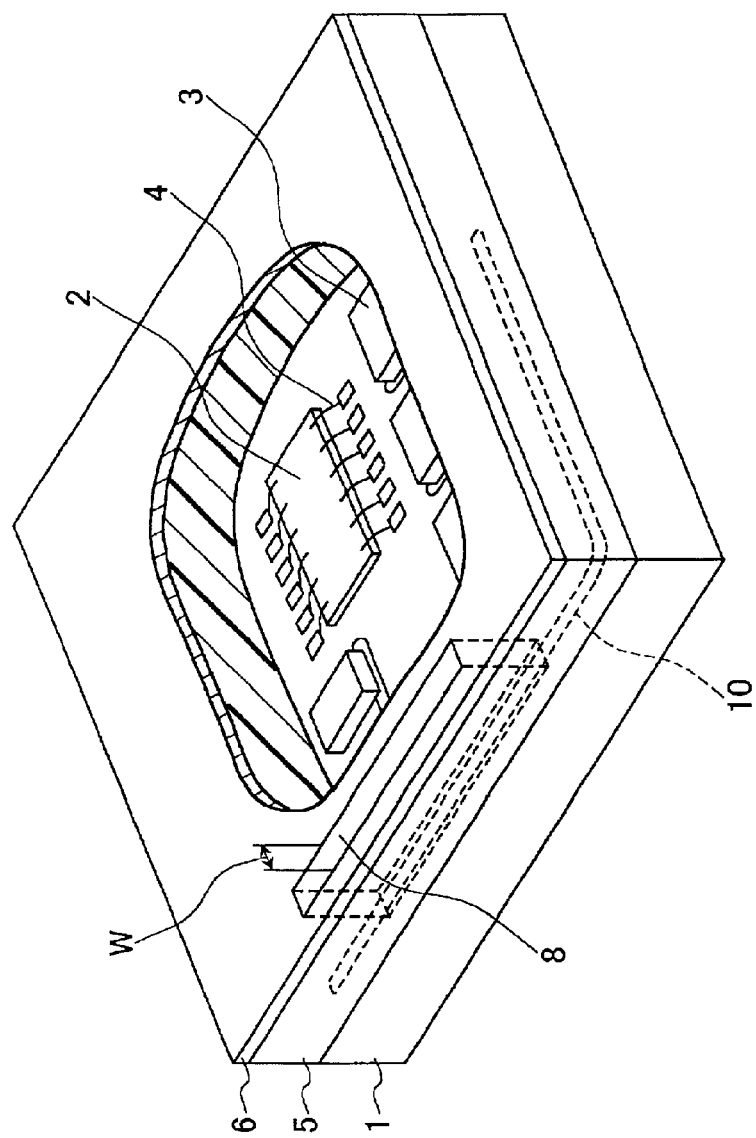
FIG. 3 is a partially cutaway perspective view of still another embodiment of the high-frequency module according to the present invention.

In the high-frequency nodule shown in FIG. 3, a slot (aperture) 8 having a rectangular shape when viewed from above is provided instead of the hole having a circular shape when viewed from above. Here, as in FIG. 2, a wiring pattern 10 is electrically connected to a metal thin film 6 by a metal thin film formed on the inner surface of this slot 8, so that the electromagnetic wave shielding effect of the metal thin film 6 can be increased. It should be noted that the shape of the aperture such as the hole 7 or the slot 8 is not limited to circular or rectangular, but also can be elliptical or any other suitable shape.

It is not necessary that the insulating resin 5 be formed so as to cover the entire region of the surface of the substrate 1, however, it is preferable that the insulating resin 5 is formed such that it seals at least the high-frequency semiconductor element 2, and further seals, in addition to this element 2, the electronic components 3 constituting a circuit processing high-frequency signals. Therefore, it is preferable that the aforementioned hole 7 or the like is provided on the substrate surface outside of the region where these parts such as the element 2 are disposed, which is, typically, the periphery of the substrate surface as shown. In a preferred embodiment of the high-frequency module of the present invention, the wiring pattern 10 such as the grounding pattern is drawn out into the periphery of the substrate surface, where the aperture such as the hole 7 is formed, through which the metal thin film 6 and the wiring pattern 10 are electrically connected to each other, as shown in FIGS. 2 and 3.

The aperture such as the hole 7 should be formed such that the minimum width (the shortest length of the aperture in a plane that is parallel to the surface of the substrate, e.g., shown as W for the slot 8 in FIG. 3) is at least 0.2 mm, so that the metal thin film can be formed easily on the inside of the aperture. If the minimum width is less than 0.2 mm, then it becomes difficult to pour the plating solution inside, for example. On the other hand, if the minimum width is larger than 5 mm, then this may impede the miniaturization of the module.

The aperture can be provided, for example, by mechanical grinding using irradiation with a laser beam, a dicer (rotating saw) or the like, but there is no limitation regarding the formation method. The cutting speed of the laser beam may vary depending on the material. For example, the speed for cutting an epoxy resin with an YAG (yttrium aluminum garnet) laser is considerably higher than that for cutting metals such as nickel. Utilizing this makes it easy to expose the wiring pattern disposed on the surface of the substrate.

Figure 4:
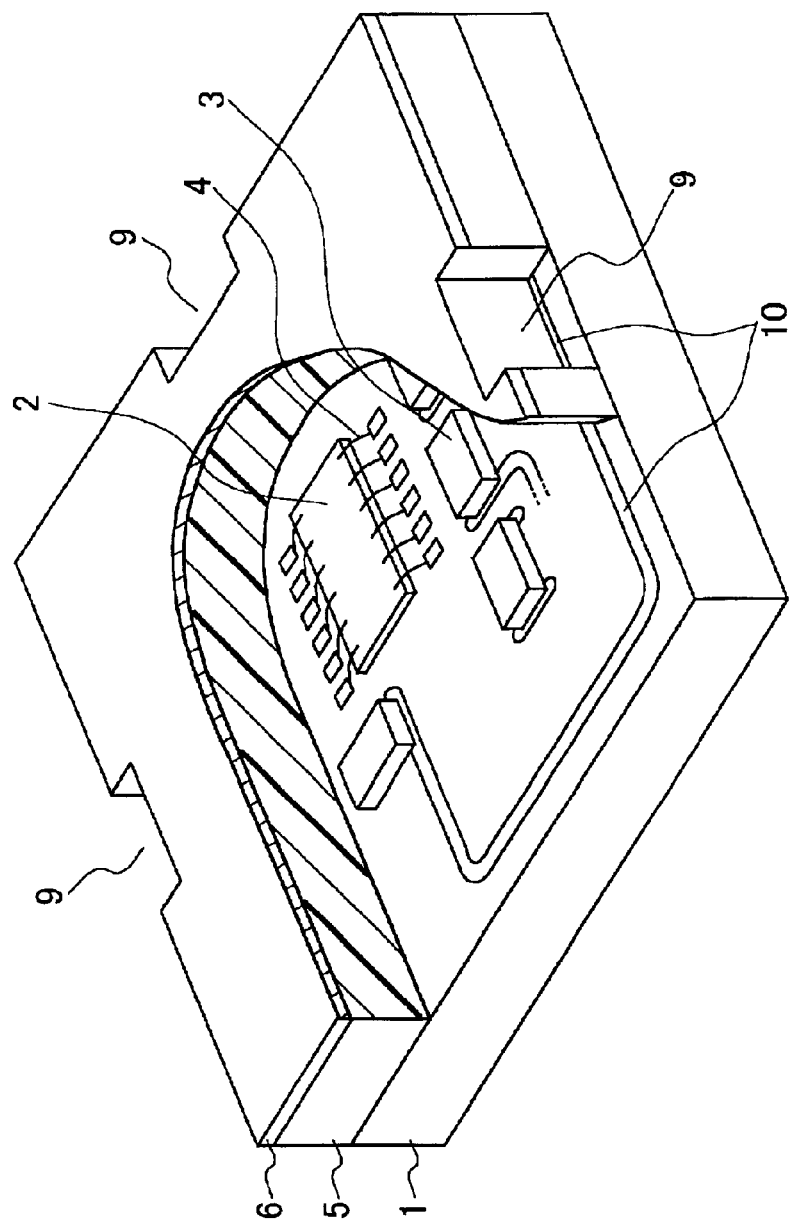
FIG. 4 is a partially cutaway perspective view of yet another embodiment of the high-frequency module according to the present invention.
Figure 5:
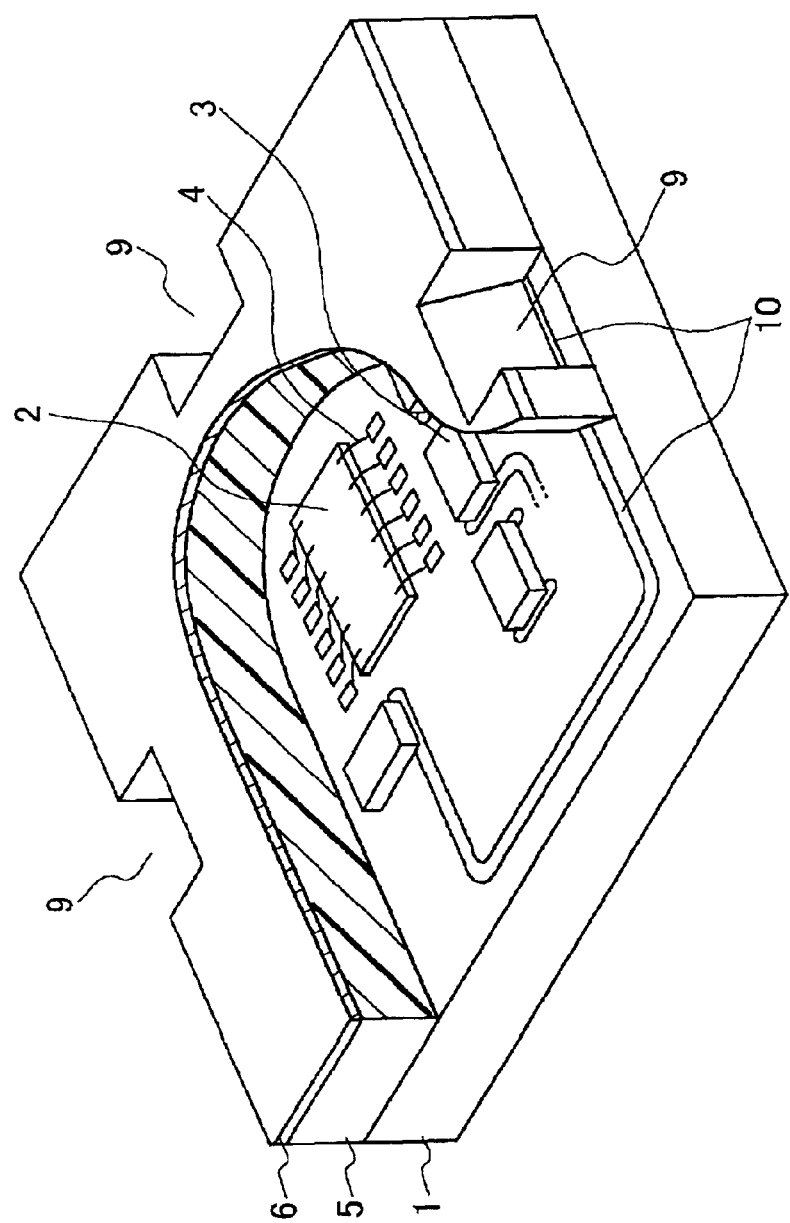
FIG. 5 is a partially cutaway perspective view of still another embodiment of the high-frequency module according to the present invention.

The wiring pattern 10 also can be exposed by providing a cut-out on a side face of the insulating resin 5 or by letting the side face recede. FIGS. 4 and 5 are partially cutaway perspective views of other embodiments of the high-frequency module in which the wiring pattern 10 is exposed at cut-outs 9 provided in the insulating resin 5. In these modules, the cut-outs 9 are formed on the periphery of the insulating resin 5 with the shape of a mold used for transfer molding, for example, and the wiring pattern 10 is exposed at the cut-outs 9. The metal thin film 6 is formed on the surface of the insulating resin 5 provided with the cut-outs 9 in this manner, (which also includes the surface of the cut-outs 9) as well as on the wiring pattern 10 exposed at the cut-outs 9, and thus, electric connection between the metal thin film 6 and the wiring pattern 10 can be ensured.

As shown in the example in FIG. 5, when a part of the sidewalls of the cut-out 9 is tapered, it becomes easier to form the metal thin film 6 on this face, so that electric connection between the metal thin film 6 and the wiring pattern 10 can be ensured more easily. Accordingly, in the high-frequency module of the present invention, in particular when the stability of the electric connection tends to be problematic (and especially when a vapor phase deposition method such as vapor deposition or sputtering is used), it is preferable that at least one side face of the aperture or the cut-out of the insulating resin 5 is tapered (in such a manner that the side face forms an acute angle with the substrate surface on the insulating resin 5 side). For example, the slot 8 in FIG. 3 may be V-shaped or U-shaped in cross section.

The above-described FIGS. 1 to 5 illustrate those embodiments in which the metal thin film 6 is not formed on the entire side face of the insulating resin 5. Although the high-frequency module of the present invention is not limited to these embodiments, when they are manufactured by a method suitable for mass-production, such modules are frequent. In this method, the high-frequency semiconductor element 2, the electronic components 3 and the like are first mounted on a plate (substrate base material) to be divided into a plurality of substrates, and sealed with an insulating resin 5. Furthermore, a metal thin film 6 is formed thereon, and then, the substrate base material is divided into the substrates. Hereinafter, an example of this method will be described with reference to FIGS. 6A to 6G.

Figure 6A:
FIGS. 6A to 6G illustrate the manufacturing steps for the high-frequency module according to the present invention in cross-sectional views of the module.
Figure 6B:
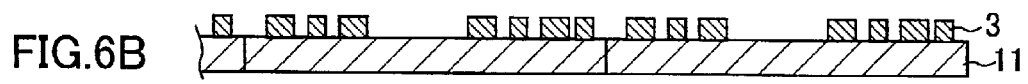
Figure 6C:
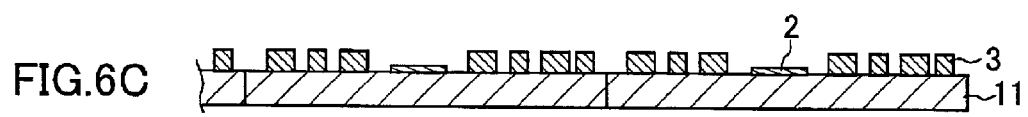
Figure 6D:
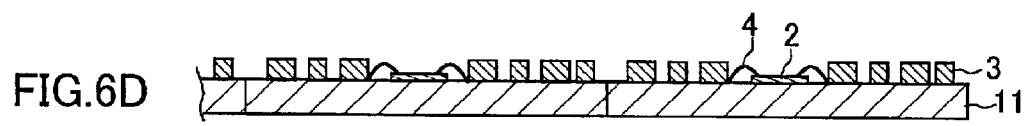
Figure 6E:
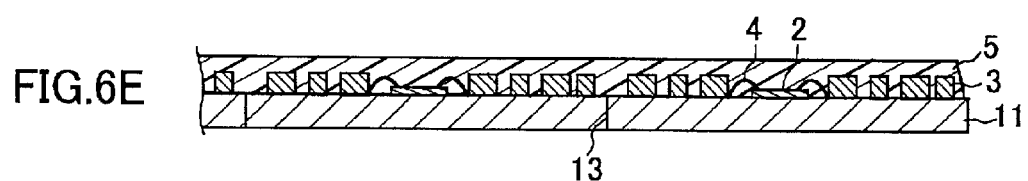
Figure 6F:
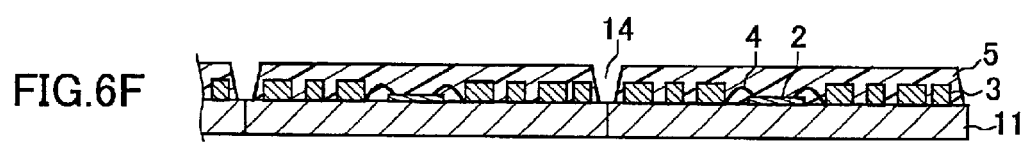
Figure 6G:
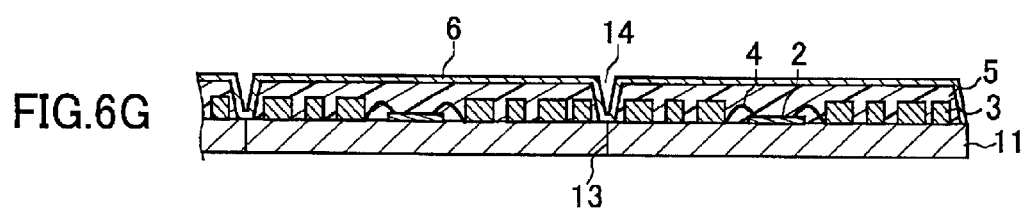

First, as it has been performed conventionally, electronic components 3 such as chip resistors and chip capacitors are mounted at predetermined positions on the substrate base material 11 (FIGS. 6A and 6B). This mounting is performed by reflow soldering using a solder paste, for example. Next, a high-frequency semiconductor element 2 is mounted likewise by soldering or the like (FIG. 6C), and then, wire bonding is performed with thin metallic wires 4 (FIG. 6D). Subsequently, an insulating resin 5 such as an epoxy resin is molded into a predetermined shape by transfer molding or the like (FIG. 6E). Furthermore, an aperture 14 is provided in the insulating resin over the intended parting line 13 at which the substrate base material 11 is to be divided by irradiation with a laser beam or the like (FIG. 6F). As described above, this aperture 14 may be formed simultaneously with the molding of the resin, by using a mold. Then, a metal thin film 6 is formed, for example by plating, on the surface of the insulating resin 5 in which the aperture 14 has been formed (FIG. 6G). Lastly, the substrate base material 11 is divided along the intended parting line 13, and thus, a module in which side faces of the resin are partially cut away as shown in FIG. 5 can be obtained.

The aperture 14 may be also formed as a slot extending along the intended parting line 13. In this case, the insulating resin 5 recedes at the periphery of the surface of the substrate 1, and thus, a high-frequency module in which a wiring pattern 10 is exposed at this receding portion can be obtained.

Figure 7:
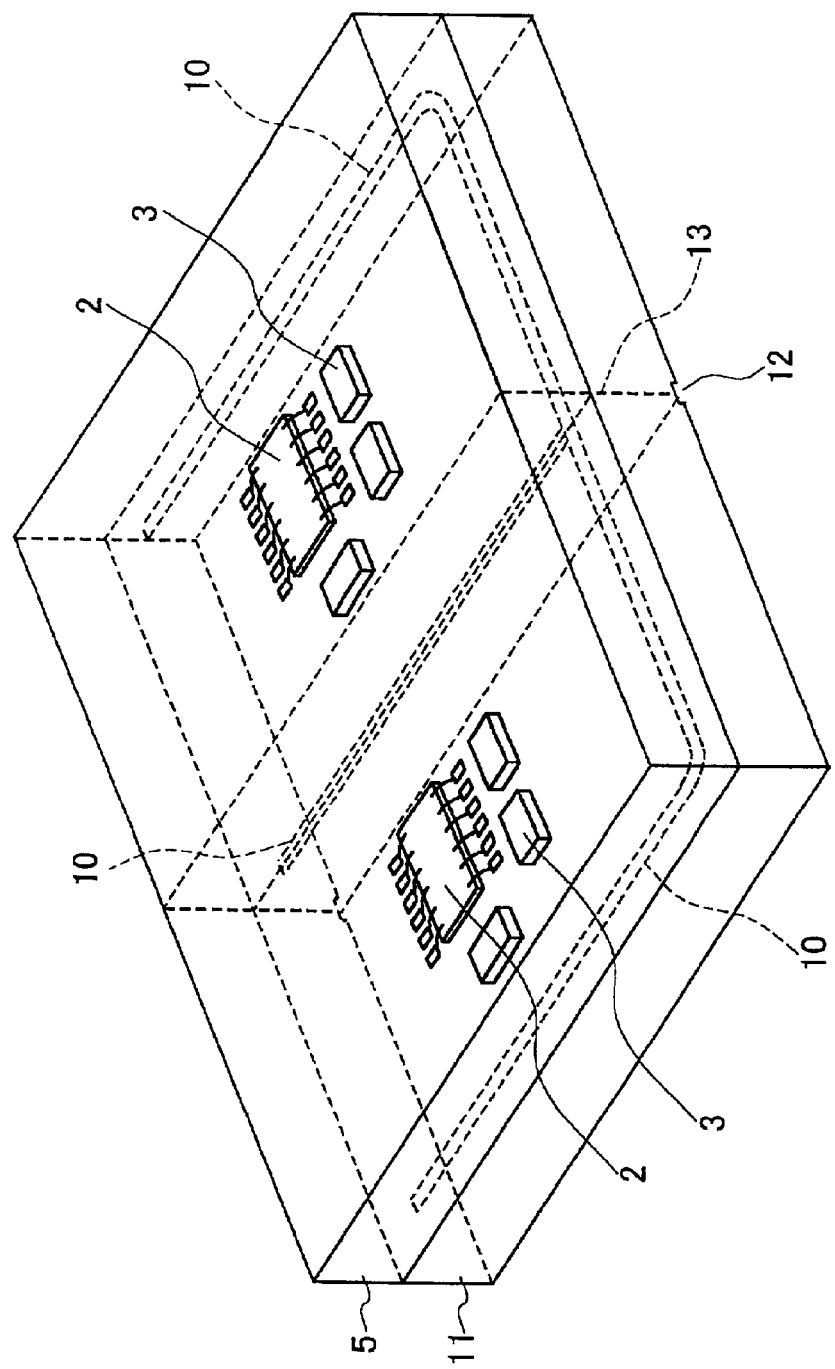
FIG. 7 is a perspective view illustrating an example of the high-frequency module according to the present invention at one manufacturing step, taken from the surface side of the substrate.
Figure 8:
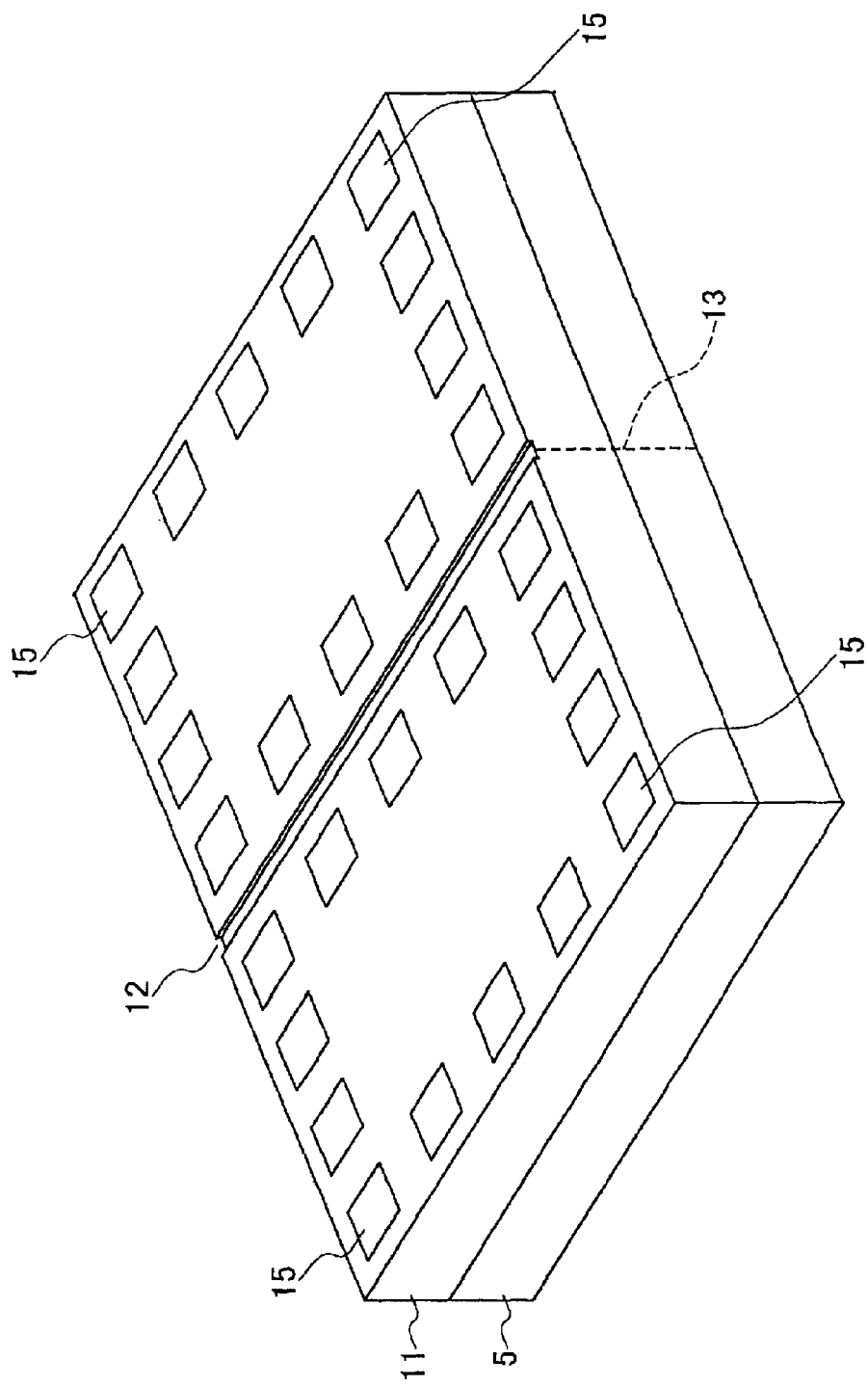
FIG. 8 is a perspective view illustrating the example at the step shown in FIG. 7, taken from the other side of the substrate.

In the manufacturing method illustrated above, a scribe line 12 may be formed along on the intended parting line 13 on the rear surface (the surface opposite to the surface on which the high-frequency circuit is formed) of the substrate base material 11, as shown in FIGS. 7 and 8. In general, through holes are often arranged on the intended parting line 13. However, when the intended parting line 13 is provided with through holes arranged thereon like a perforated line, the resin may infiltrate from the surface or leak out on the rear side.

In particular, when using a ceramic substrate, the irradiation positions of the laser beam may shift because of slight distortions of the substrate that occur during baking. However, if the substrate base material is irradiated with the laser beam from its rear side taking the scribe line as reference and along the scribe line 12 in the embodiment illustrated in FIGS. 7 and 8 for example, then, even when the wiring pattern 10 is partially shifted to the side as a result of the baking of the substrate, grinding with the laser beam can be performed with high precision along this curved wiring pattern 10. It should be noted that when a ceramic substrate is used, the scribe line or the like should be formed on the unbaked substrate (e.g., an alumina greensheet) by using a mold, for example, and then the substrate should be baked, for example, at 800 to 1300° C.

Figure 9:
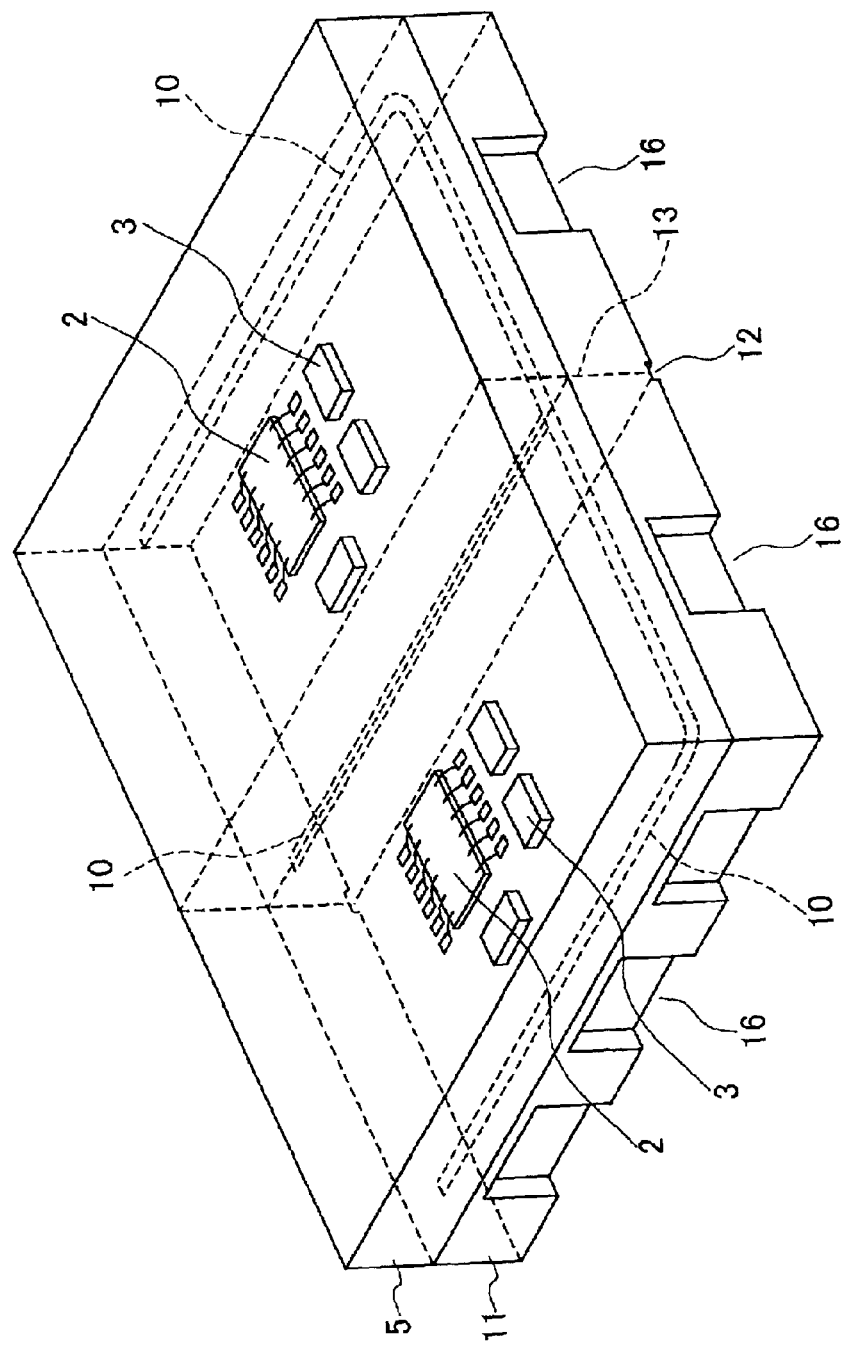
FIG. 9 is a perspective view illustrating another example of the high-frequency module according to the present invention at one manufacturing step, taken from the surface side of the substrate.
Figure 10:
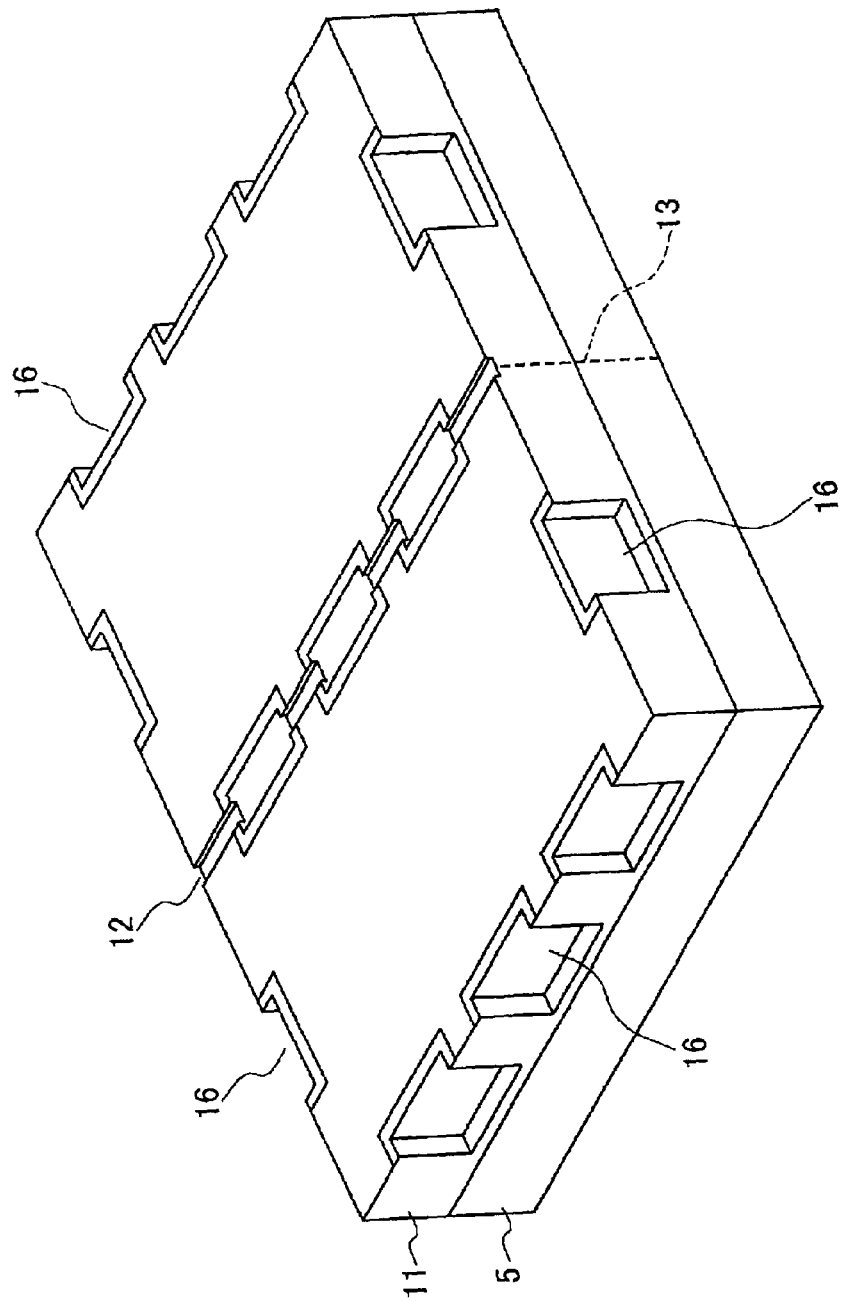
FIG. 10 is a perspective view illustrating the example at the step shown in FIG. 9, taken from the other side of the substrate.

Instead of the scribe line 12, it is also possible to use land electrodes 15 that are formed for the purpose of electrically connecting to the outside and which are arranged on the rear side of the substrate can be used as marks used for positioning to perform processes such as laser irradiation. As shown in FIGS. 9 and 10, the land electrodes 15 do not necessarily have to be provided on the rear side of the substrate, and they also may be formed as depressions arranged along the scribe line 12 such that they are also exposed at side faces of the substrate.

Figure 11:
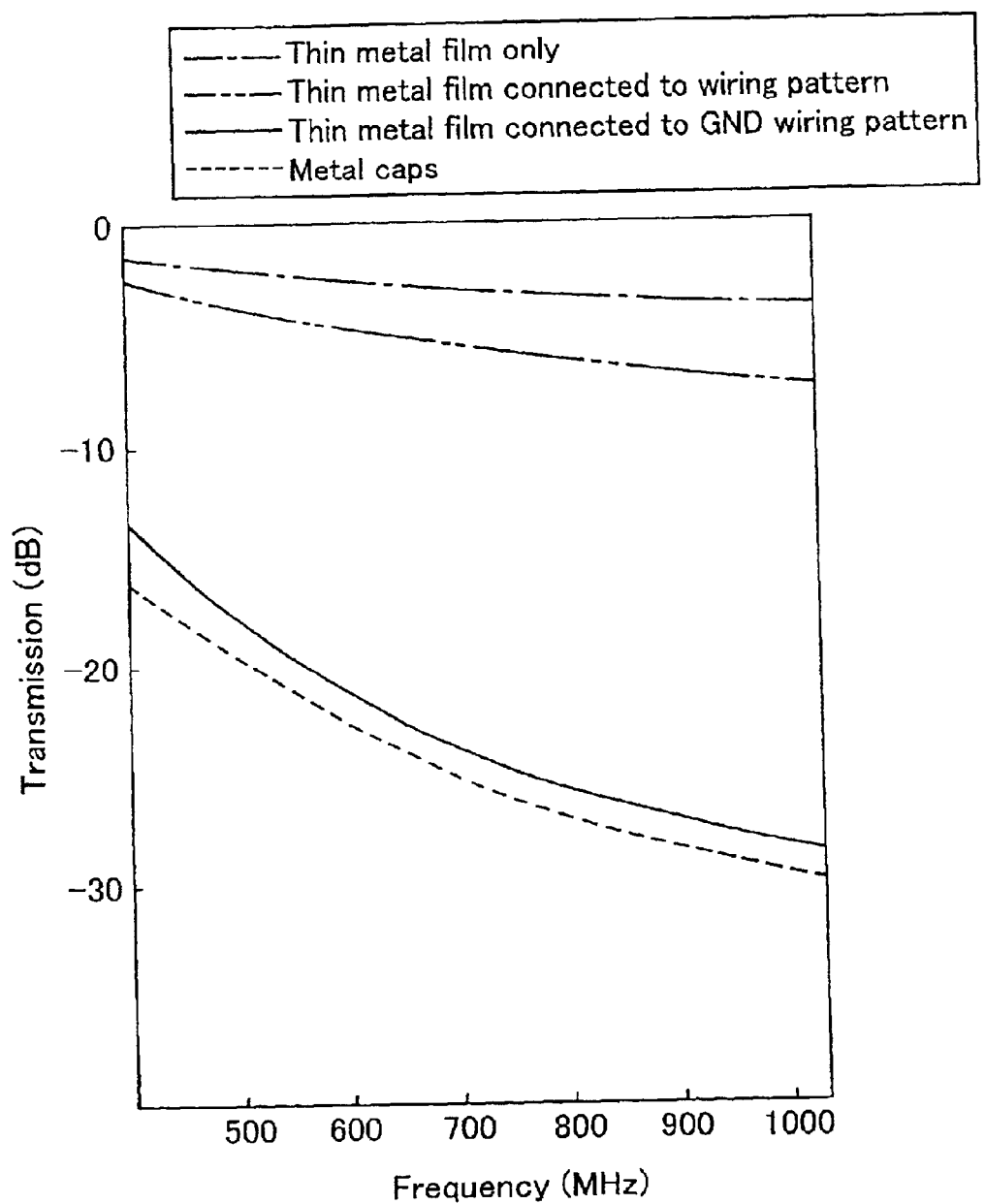
FIG. 11 is a graph illustrating the electromagnetic wave shielding properties of the high-frequency modules in comparison.
Figure 12:
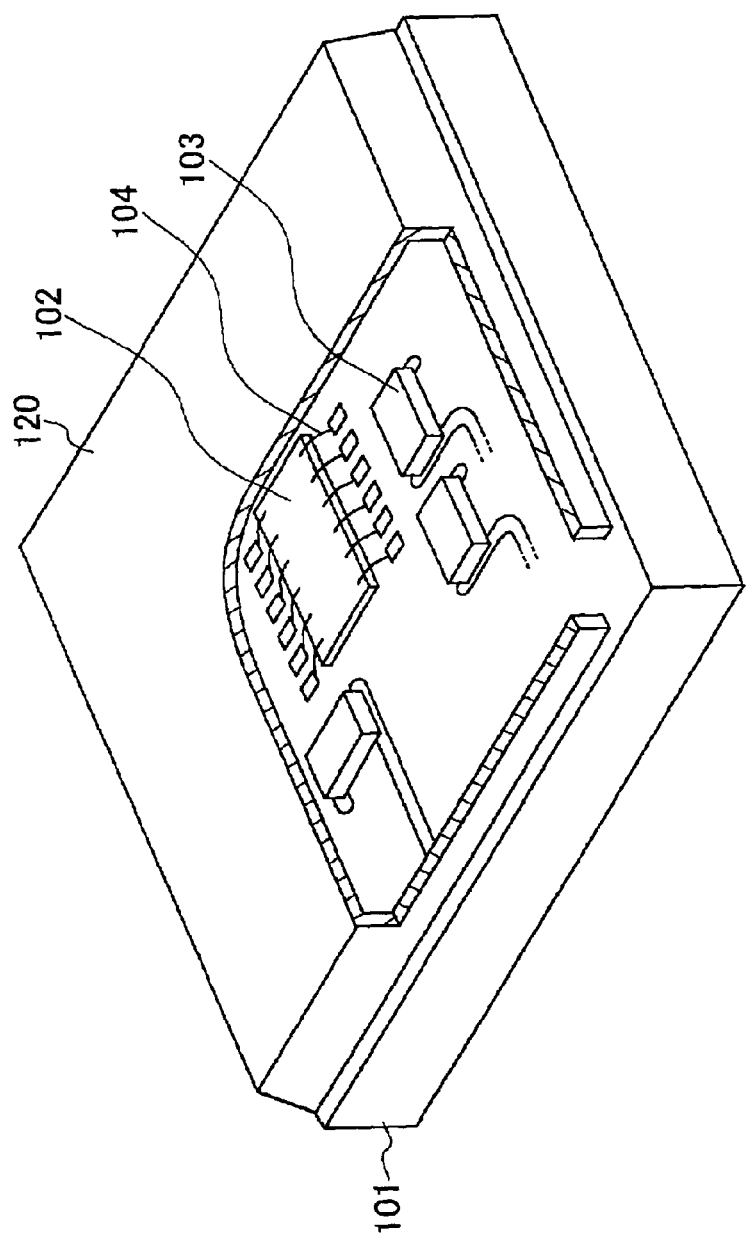
FIG. 12 is a partially cutaway perspective view of an embodiment of a conventional high-frequency module.

Hereinafter, an example of the measurement results of the electromagnetic wave shielding effect of the metal thin film 6 will be described. As the metal thin film 6, a nickel metal thin film with a thickness of 3 μm formed by electroless plating was used. As the insulating resin 5, an epoxy resin with a thickness of about 1 mm was used. FIG. 11 shows the electromagnetic wave shielding effect of modules for the case in which only the metal thin film 6 was formed (corresponding to the embodiment in FIG. 1), for the case in which the metal thin film 6 was connected to the wiring pattern 10 (corresponding to the embodiment in FIG. 2, with a voltage of 3V applied to the wiring pattern 10), and for the case in which the metal thin film 6 was connected to the wiring pattern 10 (GND wiring pattern) at a ground potential (corresponding to the embodiment in FIG. 4), as well as for the case in which a metal cap 120 was used (corresponding to the embodiment in FIG. 12). The thickness of the metal cap 120 was set to about 300 μm. It should be noted that FIG. 11 illustrates transmission of the electromagnetic wave in comparison with the case that the substrate surface is exposed as the reference (transmission at 0 dB).

As described above, according to the present invention, a high-frequency module having an advantageous structure in reducing the height thereof while shielding the electromagnetic waves can be provided.

The specific embodiments and examples described in this application are to be considered in all respects as illustrative for disclosing the present invention and not limiting, and therefore, all changes and variations can be embodied within the spirit and the following claims of the present invention.

What is claimed is:

1. A high-frequency module comprising:
   a substrate;
   a high-frequency circuit that is mounted on a surface of the substrate and comprises a high-frequency semiconductor element, the high-frequency circuit comprising a wiring pattern connected to a ground potential;
   an insulating resin formed so as to seal at least the high-frequency semiconductor element and to have a rectangular surface, the insulating resin comprising an aperture exposing the wiring pattern; and
   a metal thin film formed on an upper surface of the insulating resin,
   wherein the wiring pattern is electrically connected to the metal thin film at the aperture.

2. The high-frequency module according to claim 1, wherein the aperture has a minimum width of at least 0.2 mm and at most 5 mm.

3. The high-frequency module according to claim 1, wherein a film thickness of the metal thin film is at least 1 μm or more and at most 300 μm.

4. The high-frequency module according to claim 1, wherein the metal thin film is multilayered.

5. The high-frequency module according to claim 1, wherein the aperture in the insulating resin is provided at a periphery of the surface of the substrate.

6. The high-frequency module according to claim 1, wherein the aperture is a cut-out formed on a side face of the insulating resin.

7. The high-frequency module according to claim 1, wherein at least one inner side face of the aperture in the insulating resin is tapered such that the inner side face defines an acute angle with the substrate surface on the insulating resin side.

8. The high-frequency module according to claim 6, wherein at least one side face of the cut-out of the insulating resin is tapered such that the side face defines an acute angle with the substrate surface on the insulating resin side.

9. The high-frequency module according to claim 1, wherein the substrate is a resin substrate or a ceramic substrate.

* * * * *